United States Patent
Le Goff et al.

(10) Patent No.: US 11,227,968 B2
(45) Date of Patent: Jan. 18, 2022

(54) METHOD FOR IMPROVED MANUFACTURING OF A PHOTODIODE-BASED OPTICAL SENSOR AND ASSOCIATED DEVICE

(71) Applicants: THALES, Courbevoie (FR); COMMISSARIAT A L'ENERGIE ATOMIQUE ET AUX ENERGIES ALTERNATIVES, Paris (FR)

(72) Inventors: Florian Le Goff, Palaiseau (FR); Jean-Luc Reverchon, Palaiseau (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 28 days.

(21) Appl. No.: 16/635,480

(22) PCT Filed: Jul. 30, 2018

(86) PCT No.: PCT/EP2018/070570
§ 371 (c)(1),
(2) Date: Jan. 30, 2020

(87) PCT Pub. No.: WO2019/025354
PCT Pub. Date: Feb. 7, 2019

(65) Prior Publication Data
US 2020/0373455 A1  Nov. 26, 2020

(51) Int. Cl.
*H01L 31/18* (2006.01)
*H01L 31/103* (2006.01)
(Continued)

(52) U.S. Cl.
CPC ...... *H01L 31/1844* (2013.01); *H01L 31/1035* (2013.01); *H01L 27/14694* (2013.01); *H04N 5/378* (2013.01)

(58) Field of Classification Search
None
See application file for complete search history.

(56) References Cited

U.S. PATENT DOCUMENTS

| 2011/0031401 A1* | 2/2011 | Mitra | H01L 31/107 |
| | | | 250/338.4 |
| 2014/0346356 A1* | 11/2014 | Giffard | H01L 27/1465 |
| | | | 250/338.4 |

(Continued)

FOREIGN PATENT DOCUMENTS

| FR | 2 983 348 A1 | 5/2013 |
| WO | 2013/007753 A1 | 1/2013 |

(Continued)

OTHER PUBLICATIONS

Kinch, "50 years of HgCdTe at Texas Instruments and beyond", SPIE, vol. 7298, 72982T1-23, 2009.

(Continued)

*Primary Examiner* — Benjamin P Sandvik
(74) *Attorney, Agent, or Firm* — BakerHostetler (57) ABSTRACT

A process for fabricating a hybrid optical detector, includes the steps of: assembling, via an assembly layer, on the one hand an absorbing structure and on the other hand a read-out circuit, locally etching, through the absorbing structure, the assembly layer and the read-out circuit up to the contacts, so as to form electrical via-holes, depositing a protective layer on the walls of the via-holes, producing a doped region of a second doping type different from the first doping type by diffusing a dopant into the absorbing structure through the protective layer, the region extending annularly around the via-holes so as to form a diode, depositing a metallization layer on the walls of the via-holes allowing the doped region to be electrically connected to the contact.

16 Claims, 9 Drawing Sheets

(51) Int. Cl.
    *H01L 27/146*     (2006.01)
    *H04N 5/378*      (2011.01)

(56)          References Cited

U.S. PATENT DOCUMENTS

2019/0319071 A1*  10/2019  Hirose ................ H01L 51/4273
2020/0365631 A1*  11/2020  Reverchon ........ H01L 27/14694

FOREIGN PATENT DOCUMENTS

WO      2013/079603 A1    6/2013
WO      2017/103098 A1    6/2017

OTHER PUBLICATIONS

Goff, et al., "Surface analysis of InP and InGaAs after low temperature diffusion of Zinc", IOP publishing, Semicond. Sci. Technol. 31, (2016), 095008.

* cited by examiner

METHOD FOR IMPROVED MANUFACTURING OF A PHOTODIODE-BASED OPTICAL SENSOR AND ASSOCIATED DEVICE

CROSS-REFERENCE TO RELATED APPLICATIONS

This application is a National Stage of International patent application PCT/EP2018/070570, filed on Jul. 30, 2018, which claims priority to foreign French patent application No. FR 1700824, filed on Aug. 3, 2017, the disclosures of which are incorporated by reference in their entirety.

FIELD OF THE INVENTION

The invention relates to hybrid optical detectors operating in a given wavelength range, typically in the infrared. More particularly, the invention relates to the field of imaging based on a matrix array of photodiodes.

BACKGROUND

Imagers operating in the infrared range are generally fabricated by assembling a matrix array comprising a plurality of elementary pixels based on photodiodes, which convert a flux of incident photons into photogenerated carriers, and a read-out circuit, which is commonly referred to as an ROIC, acronym of "read-out integrated circuit", for processing the electrical signal output from the pixels of the detector. This assembly technique is referred to as hybridization.

One well-known hybridization technology employs indium bumps to electrically connect the matrix array to the read-out circuit and allows differences in coefficients of thermal expansion between the read-out circuit and photodiode matrix array to be compensated for. This configuration is not vital in the case of non-cooled components based on III-V semiconductors, for example of the type employing InGaAs on an InP substrate. It even results in a notable extra cost. Various technological solutions have been suggested with a view to avoiding the use of indium bumps: conductive polymers, gold-tin bumps, etc. These techniques remain difficult to implement and do not allow the pitch of the pixels to be easily decreased below 10 µm.

Another technology employs assembly by bonding of the ROIC circuit to the imager, this raising the problem of the electrical connection of the matrix array of photodiodes and of the contacts associated with the ROIC circuit.

A structure that solves this problem comprises via-holes and photodiodes of cylindrical symmetry around these via-holes. This photodiode is commonly referred to as a loop-hole photodiode. This structure, which consists in producing an infrared imager by coupling 3-D interconnect (ROIC circuit) and cylindrical photodiode, is referred to as a loop-hole structure, and has been known about since the 80s. A loop-hole structure with HgCdTe (or MCT) as absorbing layer is described in the publication "50 years of HgCdTe at Texas Instruments and beyond" by Michael A. Kinch, SPIE vol 7298, 72982T-1, 2009.

Figure 1A:
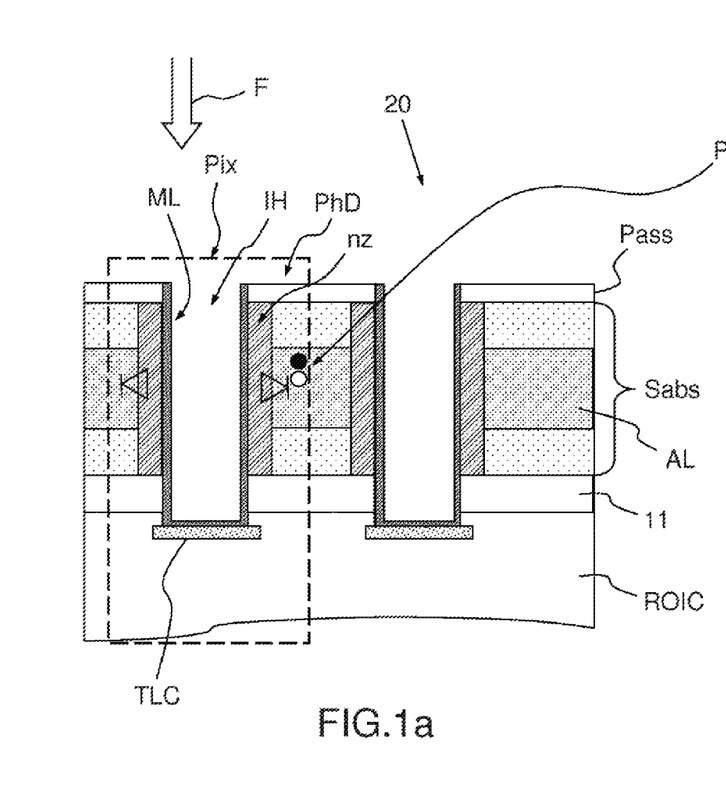
FIGS. 1a-1b illustrate an optical detector comprising a matrix array of loop-hole photodiodes based on III-V materials.
Figure 1B:
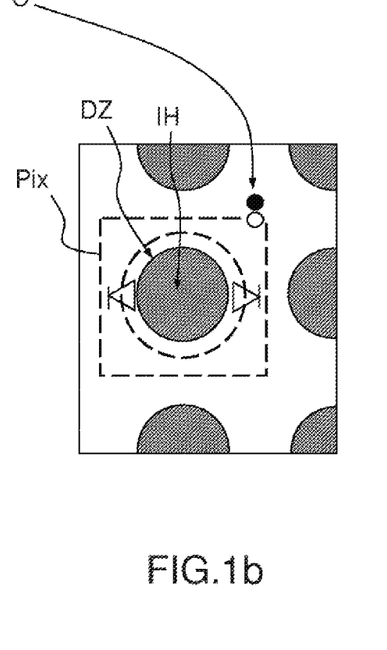

A hybrid optical detector 20 comprising a matrix array of loop-hole photodiodes that is suitable for use with an absorbing structure produced with III-V materials is illustrated in FIGS. 1a-1b, FIG. 1a corresponding to a cross-sectional view and FIG. 1b to a view from above.

The matrix array of photodetectors comprises an absorbing structure Sabs comprising at least one absorbing layer AL made of III-V material, able to generate carriers PC from a flux of incident photons F. The structure Sabs is covered with a passivation layer Pass. This structure is assembled with the circuit ROIC via an assembly layer 11, typically a dielectric.

The contacts of the read-out circuit ROIC that are intended to receive the electrical signal generated by each pixel Pix of the detector are buried top-level contacts or TLC. They are produced at the end of the process for fabricating the integrated circuits, and are located close to the surface of the circuit.

A cylindrical diode PhD is produced around a via-hole IH, which passes through the absorbing structure, the assembly layer 11 and the circuit ROIC up to the contact TLC. The walls of the hole IH are covered with a metallization layer ML, making the electrical contact between the diode PhD and the contact TLC.

The diode PhD is produced by locally doping a nearby region DZ of the hole IH a type (p in the example of FIGS. 1a-1b) opposite to the initial doping of the absorbing layer AL (n in the example of FIGS. 1a-1b). The p-n photodiode separates the photogenerated carriers and transports them to the metallization layer ML.

Document WO2013079603 describes a method for fabricating a detector 20 based on loop-hole diodes such as described above, with an absorbing layer AL made of III-V material. An example is an absorbing layer made of n-doped InGaAs placed between two encapsulating layers made of InP. The detector 20 of document WO2013079603 has a specific configuration in which the illumination is through the substrate, and a dual-purpose visible/IR imager.

The principle of the process is illustrated in FIGS. 2 to 6.

Figure 2:
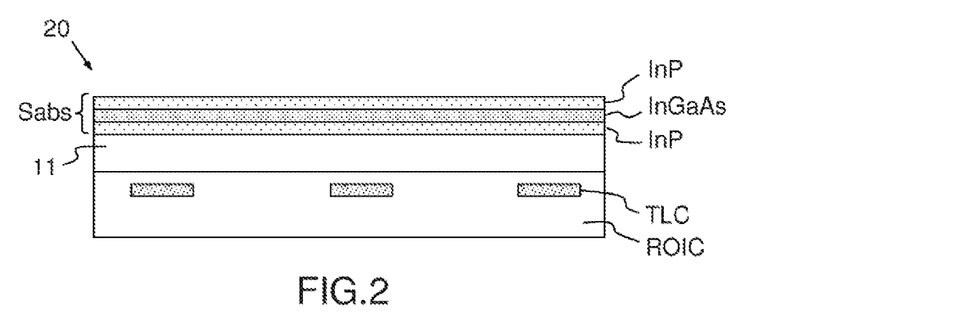
FIG. 2 illustrates an assembling first step of a process for fabricating the detector 20.

In a first step, which is illustrated in FIG. 2, a semiconductor structure Sabs comprising the three aforementioned layers is assembled, via an assembly layer 11, to a read-out circuit ROIC comprising buried contacts TLC. This assembly is achieved by bonding, a technique that is in full development and that is a substantial step forward with respect to the performance of so-called "above IC" technological steps, i.e. steps that are able to be carried out directly on the wafer of the read-out circuit ROIC, which typically is of CMOS type, and on the wafer scale, i.e. on all of the chips at the same time. This compatibility with CMOS fabricating means should enable a significant decrease in production cost and allow technological features of thinner size to be achieved.

Figure 3:
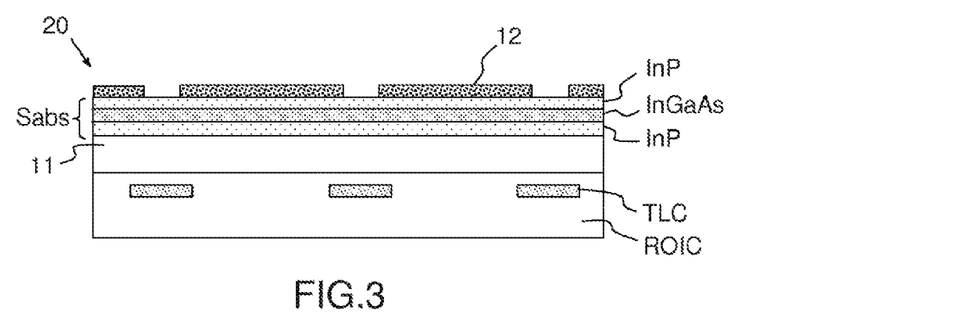
FIG. 3 illustrates a step of depositing and masking a masking dielectric.

Next, a masking dielectric 12 is deposited on the structure Sabs, and a portion of the dielectric masking layer facing the contacts TLC is etched away as shown in FIG. 3.

Figure 4:
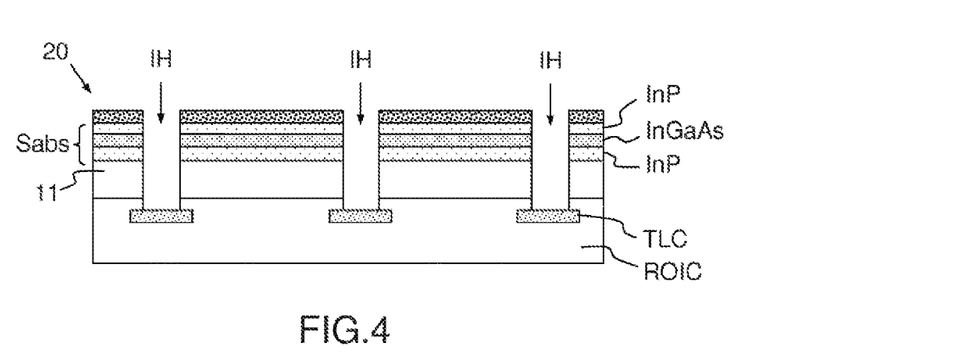
FIG. 4 illustrates a step of producing via-holes.

Via-holes IH are produced by vertical etching up to the contacts TLC, through the absorbing structure and the assembly layer, as illustrated in FIG. 4. The etching may be dry etching or wet etching.

Figure 5:
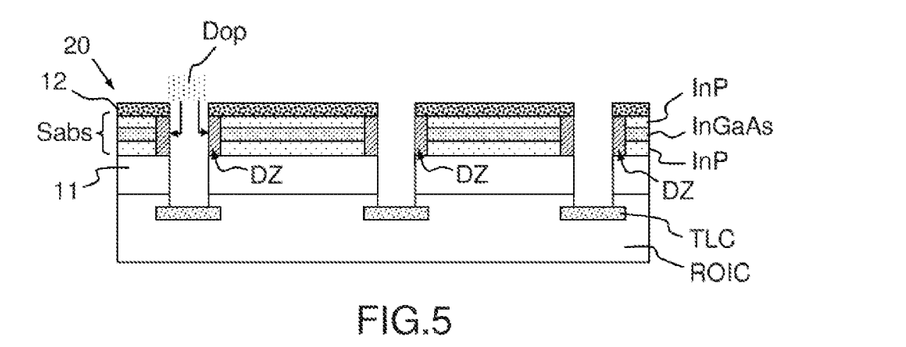
FIG. 5 illustrates a step of producing a doped region around a via-hole.

In a step illustrated in FIG. 5, a doped region DZ, for example of p-type, is produced by diffusion or ion implantation of a dopant Dop via each hole IH, so as to form a photodiode PhD comprising a cylindrical p-n junction. The diffusion is carried out starting from the surface of the walls of the hole IH, and, in parallel, through all the component layers of the absorbing structure. Preferably, the region DZ is obtained by diffusing zinc atoms.

Figure 6:
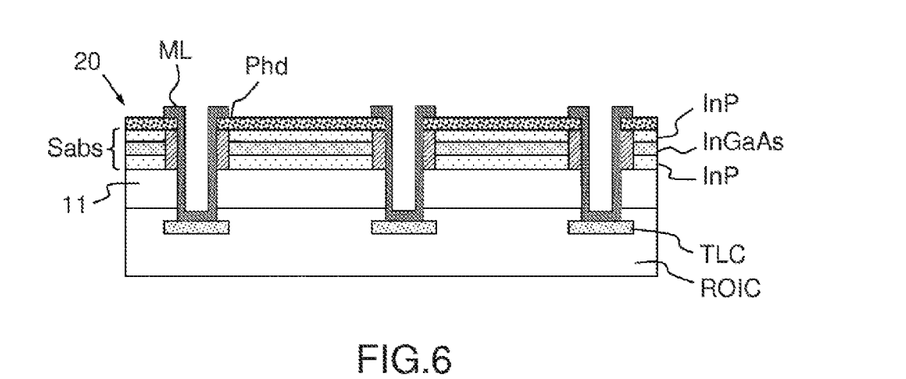
FIG. 6 illustrates a final step of metallizing the walls of the via-holes.

In a final step illustrated in FIG. 6, a metal layer ML is deposited on the walls of the holes IH so as to place the doped region DZ and the contact TLC in electrical contact.

The process for producing the loop-hole diode is carried out after the assembly with the circuit ROIC and it must therefore be carried out at a temperature below the maximum temperature that the circuit is able to withstand, typically about 400° C.

This process has a certain number of drawbacks, mainly due to the step of diffusing the dopant. Specifically, in this step the surface of the via is directly exposed and risks being degraded during the doping by diffusion. All of the constituent layers of the absorbing structure are exposed to atmosphere following the etching of the via-holes.

In particular, the inventors have demonstrated, in the document "surface analysis of InP and InGaAs after low temperature diffusion of Zinc", IOP publishing, Semicond. Sci. Technol. 31, (2016), 095008 that an InP surface is degraded during doping by diffusion of zinc, for temperatures below 425° C.: a parasitic $Zn_xP_2$ compound forms, consuming phosphorus and the indium nano-bumps, and making the InP surface nonuniform (the problem disappears at higher temperature). In this document, doping with cadmium instead of zinc is recommended to avoid this effect. However, cadmium is a toxic compound, and its use in an industrial process is problematic. Furthermore, the diffusion depth is small, this decreasing the screening of the electronic states at the surface of the hole and leading to an increase in the dark current of the detector in operation.

SUMMARY OF THE INVENTION

One aim of the present invention is to mitigate the aforementioned drawbacks with a process for fabricating a hybrid optical detector comprising a step of doping by diffusion that does not degrade the performance of the loop-hole structure.

According to a first aspect, the subject of the present invention is a process for fabricating a hybrid optical detector comprising the steps of:
assembling, via an assembly layer, on the one hand an absorbing structure that is sensitive in a wavelength band of interest, said structure comprising at least one absorbing layer made of III-V semiconductor having a first doping type chosen from n or p, and on the other hand a read-out circuit comprising a plurality of buried contacts, the read-out circuit being intended to receive an electrical signal generated from carriers photogenerated by absorption of light by the absorbing semiconductor layer and,
locally etching, through the absorbing structure, the assembly layer and the read-out circuit up to the contacts, so as to form electrical via-holes,
depositing a protective layer on the walls of the via-holes,
producing a doped region of a second doping type different from the first doping type by diffusing a dopant into the absorbing structure through said protective layer, said region extending annularly around said via-holes (IH) so as to form a diode comprising a p-n junction allowing the photogenerated carriers to be separated and transported,
depositing a metallization layer on the walls of the via-holes allowing the doped region to be electrically connected to the contact, so as to make an electrical connection between absorbing layer and read-out circuit.

According to one variant, the fabricating process according to the invention furthermore comprises a step of removing said protective layer after the step of producing the doped region and prior to the step of depositing the metallization layer.

According to one embodiment, the protective layer is a layer comprising a semiconductor that is substantially lattice matched with the one or more semiconductors of the absorbing structure, and wherein the protective layer has a defect concentration making said protective layer incompatible with a correct operation of said diode.

Advantageously, the method used to deposit the protective layer is an epitaxial method.

According to one embodiment, the protective layer is a dielectric layer.

According to another embodiment, the protective layer is a semiconductor layer belonging to a family of materials different from that of the one or more materials of the absorbing structure, said layer then not being lattice matched with the one or more semiconductors of the absorbing structure.

According to one embodiment, the method used to deposit the protective layer is an atomic-layer-deposition method.

According to another variant, the protective layer is a layer comprising a semiconductor that is lattice matched with the one or more semiconductors of the absorbing structure and wherein the protective layer has a sufficiently low defect concentration to be compatible with a correct operation of the p-n diode.

According to one variant, the via-holes are cylindrical and of square cross section. Advantageously, the via-holes of square cross section are oriented horizontally so as to select two preset crystal planes.

According to another variant, the via-holes are conical and of square cross section.

Advantageously, the protective layer has a thickness comprised between 1 and 50 nm.

Advantageously, the protective layer is deposited at a temperature below 450° C.

Advantageously, the dopant is zinc.

According to one embodiment, the III-V material of the absorbing layer is InGaAs having an n first doping type, the absorbing layer being placed between two encapsulating layers made of InP also doped n-type.

According to another aspect, the invention relates to a hybrid optical detector comprising:
an absorbing structure that is sensitive in a wavelength band of interest, said structure comprising at least one absorbing layer made of III-V semiconductor having a first doping type chosen from n or p, and a read-out circuit comprising a plurality of buried contacts, the read-out circuit being intended to receive an electrical signal generated from carriers photogenerated by absorption of light by the absorbing semiconductor layer, the absorbing structure and the read-out circuit being assembled via an assembly layer to form the hybrid optical detector,
the detector furthermore comprising electrical via-holes that pass through the absorbing structure, the assembly layer and the read-out circuit up to the contacts,
the absorbing structure comprising a doped region of a second doping type different from the first doping type extending annularly around said via-holes, so as to form a diode comprising a p-n junction allowing the photogenerated carriers to be separated and transported,
the walls of the via-hole facing the doped region being covered with a protective layer made of a semiconductor that is lattice matched with the one or more semiconductors of the absorbing structure, the protective layer being of single-crystal quality,
the via-hole walls furthermore being covered with a metallization layer, in order to electrically connect the doped region to the contact, so as to make an electrical connection between absorbing layer and read-out circuit.

BRIEF DESCRIPTION OF THE DRAWINGS

Other features, aims and advantages of the present invention will become apparent on reading the following detailed description and with reference to the appended drawings, which are given by way of nonlimiting example, and in which.

DETAILED DESCRIPTION

Figure 7:
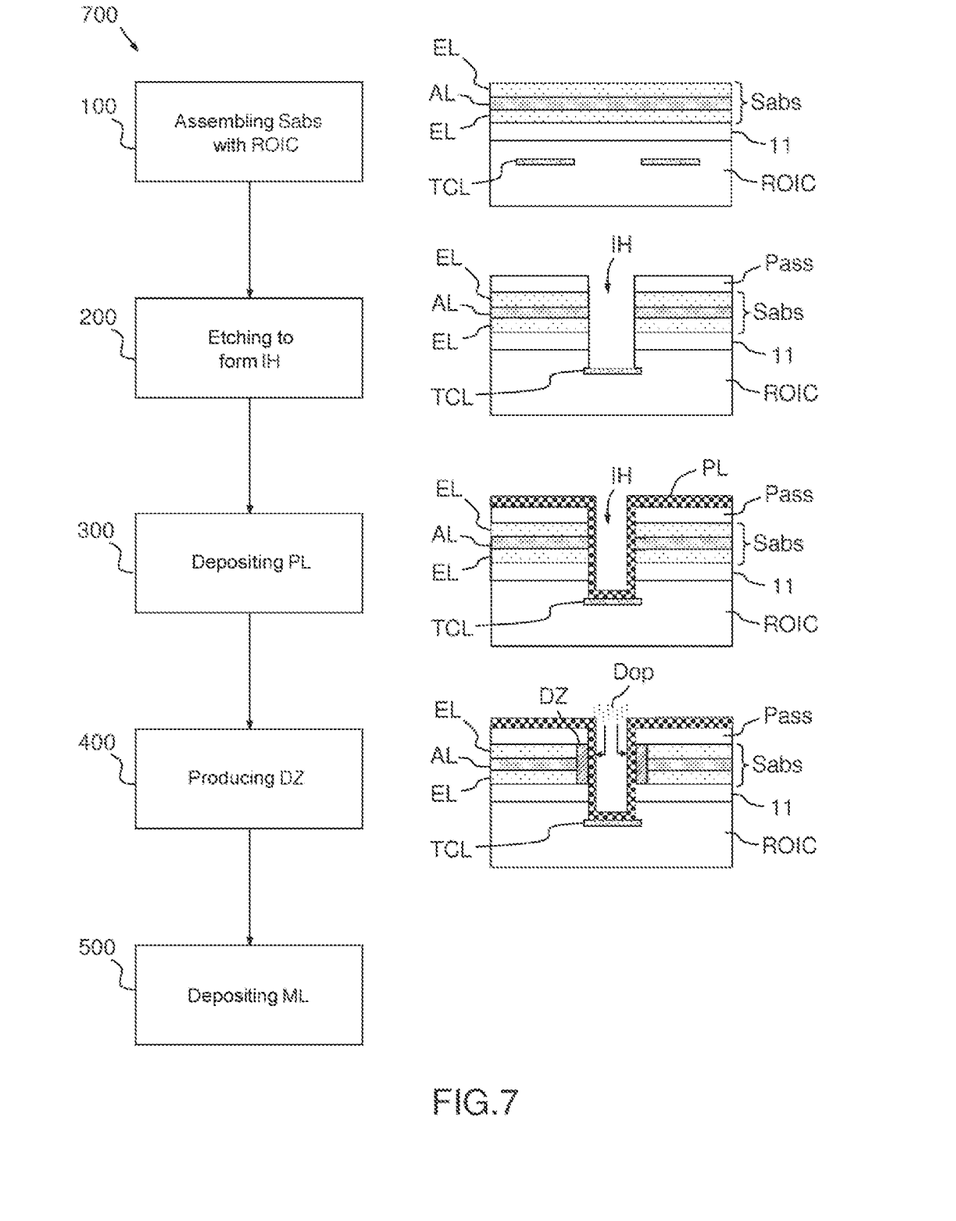
FIG. 7 illustrates the steps of the process according to the invention.

The process 700 for fabricating a hybrid optical detector according to invention is illustrated in FIG. 7.

The process comprises a first step 100 consisting in assembling, via an assembly layer 11, on the one hand an absorbing structure Sabs that is sensitive in a wavelength band of interest, and on the other hand a read-out circuit ROIC comprising a plurality of buried contacts TLC. The structure Sabs comprises at least one absorbing layer AL made of III-V semiconductor having a first doping type chosen from n or p. The total thickness of the structure is about a few microns.

The read-out circuit ROIC is intended to receive an electrical signal generated from carriers photogenerated by absorption of light by the absorbing semiconductor layer AL.

It is a question of a step similar to the step described with reference to FIG. 2.

Here, the assembly is preferably achieved by direct bonding. This method consists in specifically preparing the surface of the two structures with deposits of silica and planarization then in bringing them mechanically into contact, then in carrying out a thermal anneal (at about 200° C.).

According to one embodiment, also illustrated in FIG. 7, the absorbing structure Sabs comprises two encapsulating layers EL placed on either side of the absorbing layer AL and having a bandgap of a value higher than the value of the bandgap of the absorbing layer. These layers are also referred to as "window layers" and mainly serve to screen surface states that could generate a parasitic signal.

The window layers must be lattice matched with the absorbing layer. The entirety of the stack Sabs is produced during the same epitaxial growth. For example, the III-V material of the absorbing layer is InGaAs having an n first doping type (which may be intrinsic), the absorbing layer being placed between two encapsulating layers made of InP (which are typically weakly n-doped, i.e. with a concentration between $10^{15}$ and $10^{17}$ cm$^{-3}$). Detection in the so-called SWIR range is then obtained (SWIR being the acronym of Short Wavelength InfraRed, this range extending from 0.9 to 1.7 µm).

In a second step 200 local etching is carried out through the absorbing structure Sabs, the assembly layer 11 and the read-out circuit up to the contacts TLC, so as to form electrical via-holes IH. This step is similar to the step described with reference to FIGS. 3 and 4. The diameter of the via-holes is preferably comprised between 1 and 4 µm.

The process according to the invention then comprises a third step 300 consisting in depositing a protective layer PL on the walls of the via-holes IH.

As described below, this protective layer PL may be of various natures.

Next, in a fourth step 400, a doped region DZ of a second doping type different from the first doping type is produced by diffusing, into the absorbing structure, a dopant Dop through the protective layer PL via the holes IH. The doped region DZ extends into the absorbing structure annularly around the holes IH so as to form a loop-hole diode comprising a p-n junction allowing the carriers photogenerated when the detector is illuminated by a light beam to be detected to be separated and transported.

All of the steps, and particularly the step of depositing PL and the diffusing step, must be carried out at a temperature compatible with what the circuit ROIC is able to withstand, i.e. typically a temperature below 400° C.

The layer PL must not be degraded during the diffusion, and allows the constituent layers of the absorbing structure Sabs to be protected during the diffusing step. Preferably, the protective layer is thin, having a thickness comprised between 1 and 50 nm, and more preferably between 1 and 20 nm, because it must allow the dopant Dop to diffuse into the materials of the structure Sabs to be doped.

Furthermore, this layer has an influence on the depth and level of doping of the region DZ, essentially because of the modification that its presence induces in the surface finish of the walls through which the diffusion occurs (vacancy concentration, etc.). In the case of an InP/InGaAs/InP absorbing structure, the protective layer will allow the InP layers, which are degraded by zinc as described above, to be protected.

According to one embodiment, the dopant Dop is zinc, the doping with zinc atoms inducing a doping of p-type.

Lastly, the process according to the invention comprises a step 500 of depositing a metallization layer ML on the walls of the via-holes, allowing the doped region DZ to be electrically connected to the contact TLC, so as to make an electrical connection between absorbing layer AL and read-out circuit ROIC.

The process according to the invention thus allows a hybrid optical detector based on loop-hole photodiodes to be produced while guaranteeing that the diffusing step does not degrade the walls of the holes, leading subsequently to p-n (or n-p) loop-hole diodes that operate correctly. Furthermore, the layer PL acts as a diffusion "engine", this improving the penetration depth of the atoms of the dopant Dop and increasing the concentration thereof and hence the doping level. This allows the electronic defects induced by the via-hole to be more effectively screened, improving the performance of the detector in terms of parasitic signals.

Figure 8:
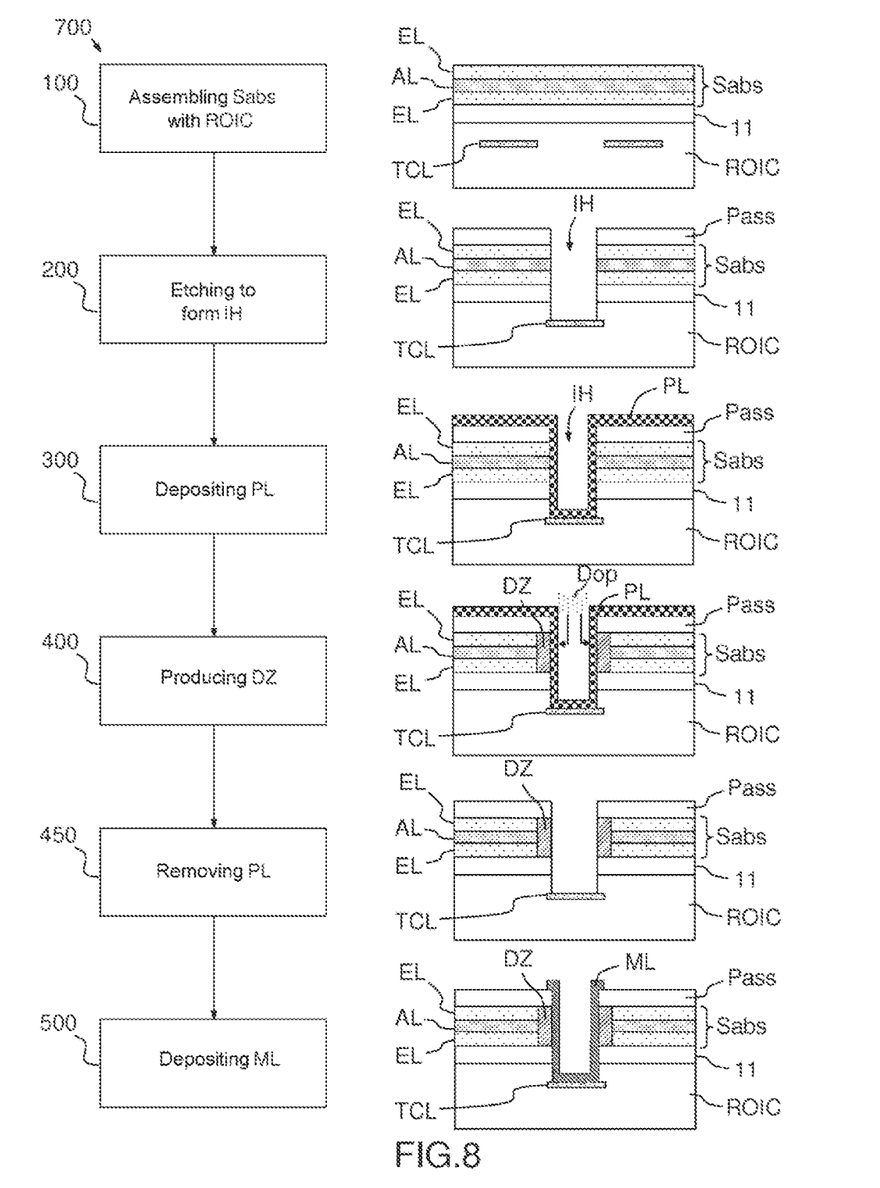
FIG. 8 illustrates a first variant of the process according to the invention.

According to a first variant of the fabricating process according to the invention, the protective layer does not have a sufficient quality to be preserved. According to this variant, the process according to the invention furthermore comprises a step 450 of removing the protective layer PL once the step 400 of diffusing the dopant has been carried out and prior to the step 500 of depositing the metallization layer, such as illustrated in FIG. 8.

The removal is typically achieved by wet or dry (plasma) chemical etching.

According to a first embodiment requiring the removal of the layer PL, the protective layer is a layer PLsca comprising a semiconductor that is substantially lattice matched with the one or more semiconductors from which the absorbing structure is made. This embodiment corresponds to the case where the semiconductor protective layer PL has too high a defect concentration, preventing a transport of carriers compatible with correct operation of the loop-hold diode.

By substantially lattice matched what is meant is a sufficient match to allow use, to deposit the layer PLsca, of an epitaxial method. It may be a question of molecular beam epitaxy (MBE), gas-source molecular beam epitaxy (GSMBE), metalorganic vapor phase epitaxy (MOVPE), hydride vapor phase epitaxy (HVPE), etc.

Typically, the layer PL has a thickness from 1 to 100 nm, and preferably from 1 to 50 nm. This thickness depends on the ease of deposition and the aspect ratio of the via (diameter versus depth).

Figure 9:
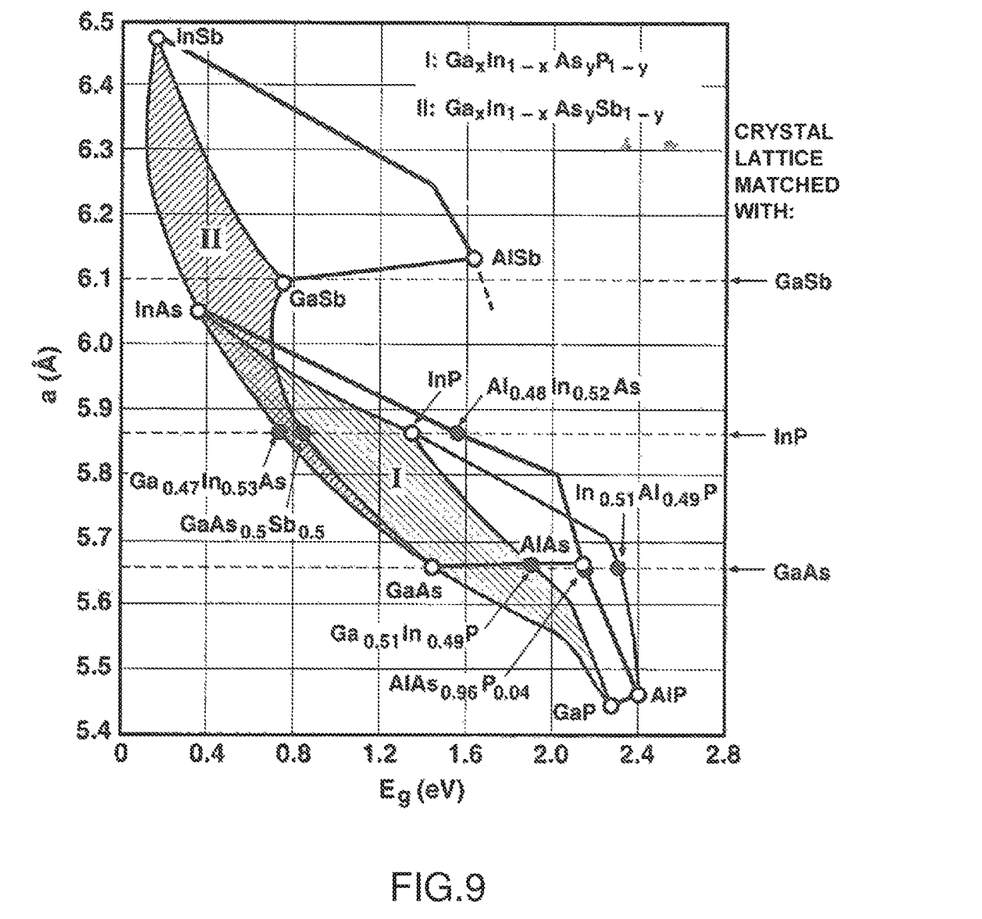
FIG. 9 is a graph representing various semiconductor compounds as points, with bandgap on the x-axis and the value in Ångstroms of the lattice constant on the y-axis.

The layer is preferably localized to the walls of the via corresponding to the edge face of the absorbing structure Sabs, but may potentially form on the edge face of the passivation layer and at the bottom on the contact. There are families of semiconductor compounds having a good lattice match, as illustrated in FIG. 9. FIG. 9 plots the various compounds as points on a graph with bandgap in eV on the x-axis and the value in Angstroms of the lattice constant on the y-axis.

In the case of an InP/InGaAs/InP absorbing structure, the deposition of a protective layer made of $Ga_{0.47}In_{0.53}As$ allows such a lattice match.

According to a second embodiment requiring the removal of the layer PL, also illustrated in FIG. 8, the protective layer is a dielectric layer PLd. Typically, the dielectric is chosen from: $HfO_2$, $SiO_2$, and $Al_2O_3$.

The advantage of using a dielectric is that the lattice-match condition is not a constraint and that lower-temperature deposition methods, such as sputtering, evaporation and plasma-phase deposition, may be used. The nature of this layer is very different from that of the absorbing structure, it is easier to remove.

The layer completely covers the walls and bottom of the via.

Preferably, to obtain a very thin deposition of a few nm having a controlled thickness, an atomic layer deposition (ALD) is carried out.

According to a third embodiment, the protective layer is a semiconductor layer PLscna of a family different from that of the absorbing-structure compounds, and is therefore not lattice matched therewith. This layer may also be deposited with a conformal method such as ALD.

Typically, the semiconductor is ZnO or ZnSe—this is an embodiment equivalent to the production with dielectric.

Figure 10:
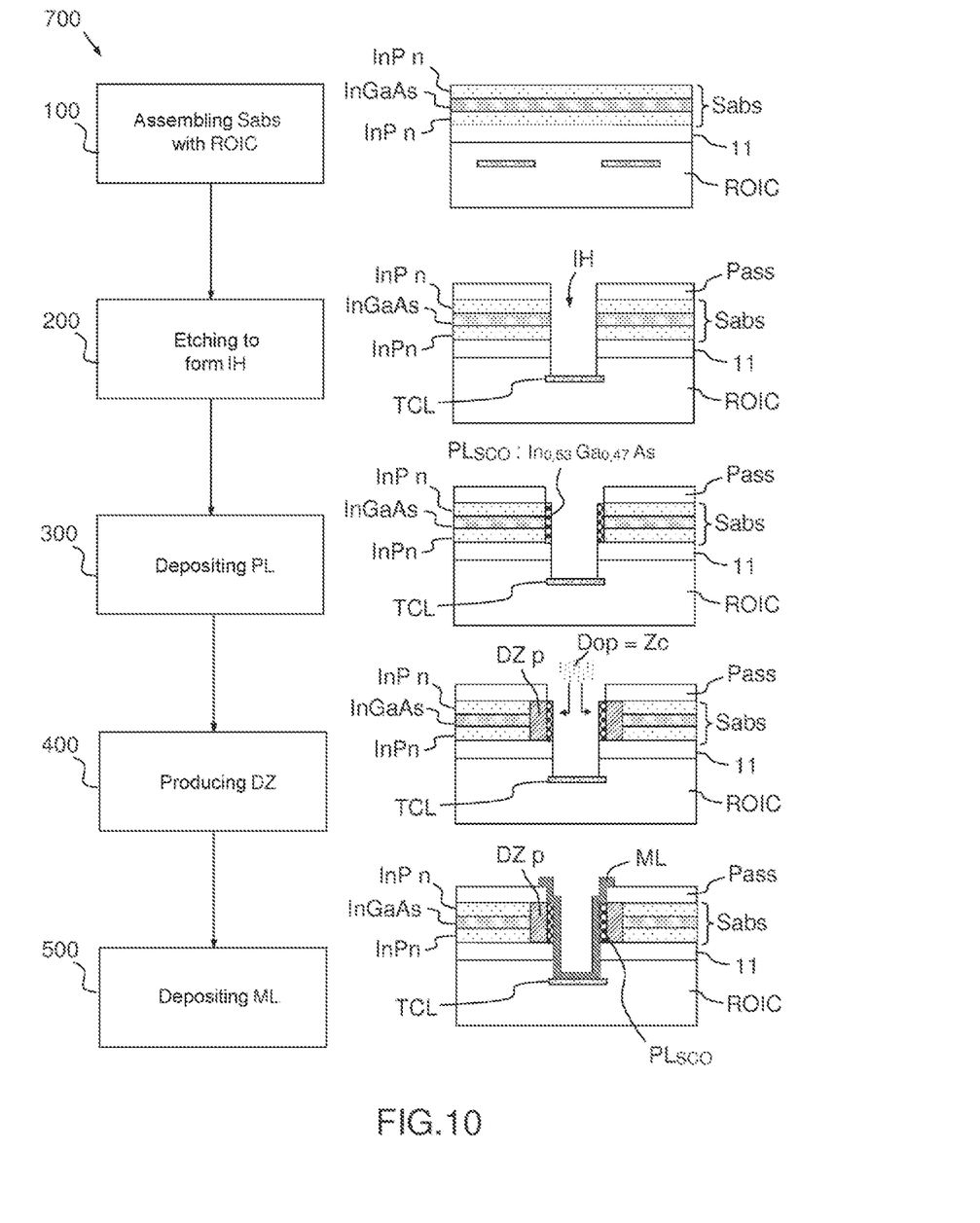
FIG. 10 illustrates a second variant of the process according to the invention, in which the protective layer is a semiconductor layer that is lattice matched with the one or more semiconductors and of crystallographic quality.

According to a second variant illustrated in FIG. 10, the protective layer is a semiconductor layer PLsc0 that is lattice matched with the one or more semiconductors of the absorbing structure, and that has a sufficiently low defect concentration to allow the transport of the carriers. The layer PLsc0 is thus compatible with correct operation of the p-n loop-hole diode. It is therefore no longer removed.

FIG. 10 illustrates the example of an InP/InGaAs/InP absorbing structure.

This layer is deposited using an epitaxial method in which the control of all of the parameters of the deposition is increased. "Epitaxial regrowth" is spoken of, and the layer PLsc0 is therefore single-crystal.

Because it is a question of epitaxial regrowth, this layer is localized solely to the walls of the via corresponding to the edge face of the layers from which the absorbing layer is made, as illustrated in FIG. 10 by the schematics corresponding to steps 300, 400 and 500.

For an InP/InGaAs/InP structure, this layer is made of $Ga_{0.47}In_{0.53}As$.

This layer is trickier to produce, but has the advantage of being compatible with the operation of the loop-hole diode—there is no need to remove it after the diffusing step. Specifically, it has the same type of doping as Sabs for a given dopant and is electrically conductive, this allowing electrical continuity with the structure.

The metallization layer ML is therefore deposited on top of the epitaxial layer PLsc0, as illustrated in FIG. 10 by the schematic located next to the final step 500.

Figure 11:
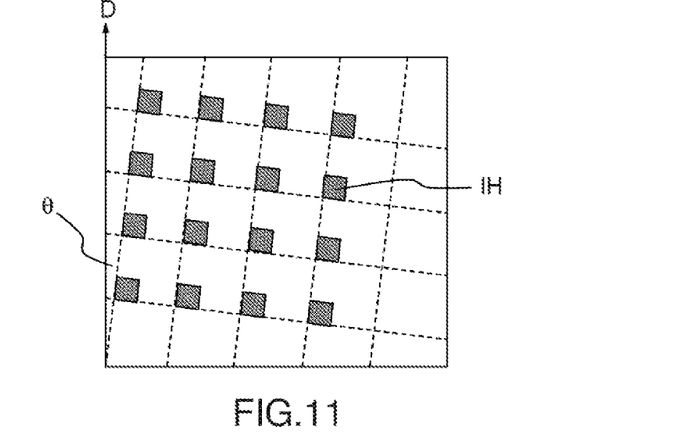
FIG. 11 illustrates a variant in which the via-holes of square cross section are oriented horizontally by a defined angle.

According to one embodiment, the via-holes are of cylindrical shape and of square cross section. The vertical planar walls of the via-hole IH that result therefrom allow a number of growth directions limited to 2 to be obtained. Thus it becomes simpler to determine the thermodynamic conditions of the epitaxial growth. As a variant, the via-holes of square cross section are oriented horizontally by an angle θ defined so as to select, in the via IH, the crystal planes most suitable for the growth process used, such as illustrated in FIG. 11, which corresponds to a top view of the optical detector. The angle θ is for example measured with respect to the direction D perpendicular to the primary flat. In the case of an absorbing structure made of InP and InGaAs, it is known that an angle of 0° gives the best quality regrowth material.

Figure 12:
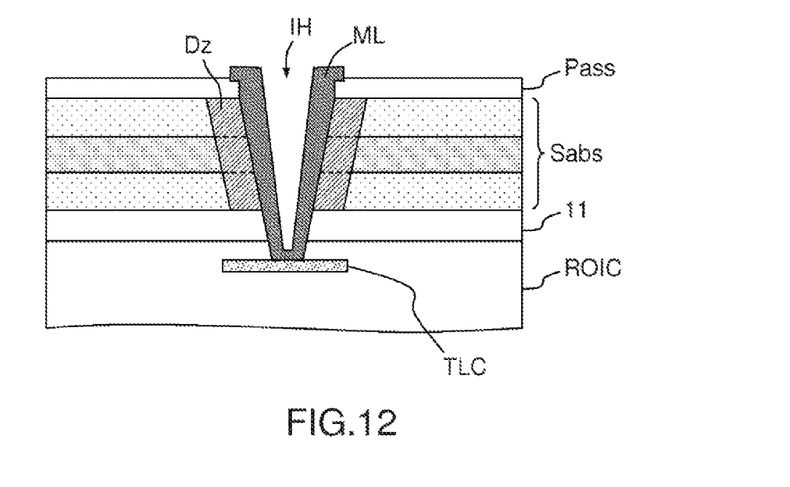
FIG. 12 illustrates an embodiment in which the via-holes are of cone shape.

According to another embodiment, the via-holes are of cone shape, such as illustrated in FIG. 12 for a detector fabricated with a fabricating method according to the first variant (removal of the layer PL). Preferably the vias are of square cross section.

As regards the constituent materials of the (so-called active) absorbing structure, the InP of the wide-bandgap and electron-collecting encapsulating layers may be replaced by InAlSb, GaSb or $Al_xGa_{(1-x)}As_ySb_{(1-y)}$. As regards the narrower-bandgap absorbing layer, the InGaAs may be replaced by InSb or InAsSb in order to obtain imagers in MWIR bands.

Other associations of semiconductors are possible, depending on the desired wavelength range of interest. The examples below are given indicatively and non-exhaustively.

| Spectral range of interest | Wide-bandgap window layer | Narrower-bandgap absorbing layer |
| --- | --- | --- |
| SWIR | InP | InGaAs |
| SWIR | Si | SiGe or Ge |
| MWIR | GaSb or $Al_xGa_{(1-x)}As_ySb_{(1-y)}$ | InAsSb or InAsSb/InAs SRL |
| MWIR | InAlSb | InSb |
| LWIR | GaSb or $Al_xGa_{(1-x)}As_ySb_{(1-y)}$ | GaSb/InAs SRL |
| UV | AlGaN or AlInN | GaN or AlGaN |

Figure 13:
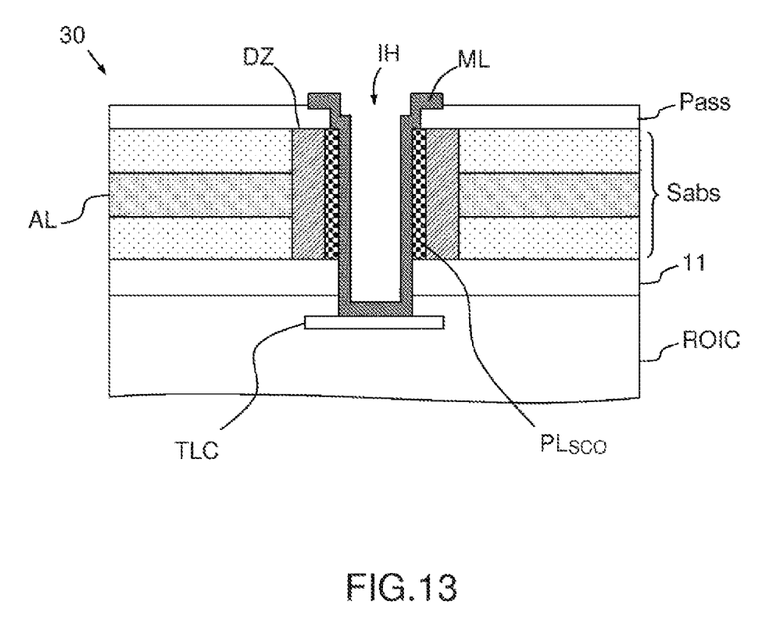
FIG. 13 illustrates a detector according to the invention.

According to another aspect, the invention relates to a hybrid optical detector 30 (illustrated in FIG. 13) comprising:

an absorbing structure Sabs that is sensitive in a wavelength band of interest, said structure comprising at least one absorbing layer AL made of III-V semiconductor having a first doping type chosen from n or p, and a read-out circuit ROIC comprising a plurality of buried contacts TLC. The read-out circuit is intended to receive an electrical signal generated from the carriers photogenerated by absorption of light by the absorbing semiconductor layer AL. The absorbing structure and the read-out circuit are assembled via an assembly layer 11 in order to form the hybrid optical detector 30.

The detector 30 furthermore comprises electrical via-holes IH that pass through the absorbing structure Sabs, the assembly layer 11 and the read-out circuit ROIC up to the contacts TLC.

The absorbing structure comprises a region DZ doped a second doping type different from the first doping type, extending annularly around said via-holes IH, so as to form a diode PhD comprising a p-n junction allowing the photogenerated carriers to be separated and transported.

The walls of the via-holes facing the doped region (DZ) are covered with a protective layer (PLsc0) made of a semiconductor that is lattice matched with the one or more semiconductors of the absorbing structure, the protective layer being of crystallographic quality.

The walls of the via-holes are furthermore covered with a metallization layer ML, in order to electrically connect the doped region (DZ) to the contact TLC, so as to make an electrical connection between absorbing layer AL and read-out circuit ROIC.

The detector 30 is the detector produced according to the variant of the fabricating method according to the invention illustrated in FIG. 10. The protective layer PLsc0 is deposited using an epitaxial method on the walls of the doped region.

The invention claimed is:

1. A process for fabricating a hybrid optical detector comprising the steps of:
   assembling, via an assembly layer, (i) an absorbing structure (Sabs) that is sensitive in a wavelength band of interest, said structure comprising at least one absorbing layer (AL) made of III-V semiconductor having a first doping type chosen from n or p, and (ii) a read-out circuit (ROIC) comprising a plurality of buried contacts (TLC), the read-out circuit receiving an electrical signal generated from carriers photogenerated by absorption of light by the absorbing semiconductor layer (AL) and,
   locally etching, through the absorbing structure, the assembly layer and the read-out circuit up to the contacts, so as to form electrical via-holes (IH),
   depositing a protective layer (PL, PLsca, PLd, PLscna, PLsc0) on the walls of the via-holes,
   producing a doped region (DZ) of a second doping type different from the first doping type by diffusing a dopant (Dop) into the absorbing structure through said protective layer, said region extending annularly around said via-holes (IH) so as to form a diode (PhD) comprising a p-n junction allowing the photogenerated carriers to be separated and transported,
   depositing a metallization layer (ML) on the walls of the via-holes (IH) allowing the doped region (DZ) to be electrically connected to the contact (TLC), so as to make an electrical connection between absorbing layer (AL) and read-out circuit (ROIC).

2. The process as claimed in claim 1, further comprising a step of removing said protective layer (PLsca, PLd, PLscna) after the step of producing the doped region and prior to the step (500) of depositing the metallization layer.

3. The process as claimed in claim 2, wherein the protective layer (PLsca) is a layer comprising a semiconductor that is substantially lattice matched with the one or more semiconductors of the absorbing structure, and wherein the protective layer has a defect concentration making said protective layer incompatible with a correct operation of said diode.

4. The process as claimed in claim 3, wherein the method used to deposit the protective layer is an epitaxial method.

5. The process as claimed in claim 2, wherein the protective layer (PLd) is a dielectric layer.

6. The process as claimed in claim 2, wherein the protective layer (PLscna) is a semiconductor layer belonging to a family of materials different from that of the one or more materials of the absorbing structure, said layer then not being lattice matched with the one or more semiconductors of the absorbing structure.

7. The process as claimed in claim 5, wherein the method used to deposit the protective layer is an atomic-layer-deposition (ALD) method.

8. The process as claimed in claim 1, wherein the protective layer is a layer (PLsc0) comprising a semiconductor that is lattice matched with the one or more semiconductors of the absorbing structure and wherein the protective layer has a sufficiently low defect concentration to be compatible with a correct operation of the p-n diode.

9. The process as claimed in claim 1, wherein the via-holes are cylindrical and of square cross section.

10. The process as claimed in claim 9, wherein the via-holes of square cross section are oriented horizontally so as to select two preset crystal planes.

11. The process as claimed in claim 1, wherein the via-holes are conical and of square cross section.

12. The fabricating process as claimed in claim 1, wherein the protective layer has a thickness comprised between 1 and 50 nm.

13. The fabricating process as claimed in claim 1, wherein the protective layer is deposited at a temperature below 450° C.

14. The fabricating process as claimed in claim 1, wherein the dopant is zinc.

15. The process as claimed in claim 1, wherein the III-V material of the absorbing layer is InGaAs having an n first doping type, the absorbing layer being placed between two encapsulating layers made of InP also doped n-type.

16. A hybrid optical detector comprising:
   an absorbing structure (Sabs) that is sensitive in a wavelength band of interest, said structure comprising at least one absorbing layer (AL) made of III-V semiconductor having a first doping type chosen from n or p, and a read-out circuit (ROIC) comprising a plurality of buried contacts (TLC), the read-out circuit receiving an electrical signal generated from carriers photogenerated by absorption of light by the absorbing semiconductor layer (AL), the absorbing structure and the read-out circuit being assembled via an assembly layer to form the hybrid optical detector,
   the detector further comprising electrical via-holes (IH) that pass through the absorbing structure, the assembly layer and the read-out circuit (ROIC) up to the contacts (TLC), the absorbing structure comprising a doped region (DZ) of a second doping type different from the first doping type extending annularly around said via-holes (IH), so as to form a diode (PhD) comprising a p-n junction allowing the photogenerated carriers to be separated and transported, the walls of the via-hole facing the doped region (DZ) being covered with a protective layer (PLsc0) made of a semiconductor that is lattice matched with the one or more semiconductors of the absorbing structure, the protective layer being of single-crystal quality, the via-hole walls further being covered with a metallization layer (ML), in order to electrically connect the doped region (DZ) to the contact (TLC), so as to make an electrical connection between absorbing layer (AL) and read-out circuit (ROIC).

\* \* \* \* \*

UNITED STATES PATENT AND TRADEMARK OFFICE
CERTIFICATE OF CORRECTION

PATENT NO. : 11,227,968 B2  
APPLICATION NO. : 16/635480  
DATED : January 18, 2022  
INVENTOR(S) : Le Goff et al.

Page 1 of 1

It is certified that error appears in the above-identified patent and that said Letters Patent is hereby corrected as shown below:

On the Title Page

In Foreign Application Priority Data item (30) please add:
August 3, 2017 (FR) 1700824.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*